(12) United States Patent
Wan Azha et al.

(10) Patent No.: US 11,071,212 B2
(45) Date of Patent: Jul. 20, 2021

(54) SEMICONDUCTOR DEVICE MANUFACTURING METHOD

(71) Applicant: FUJI ELECTRIC CO., LTD., Kawasaki (JP)

(72) Inventors: Bin Wan Mat Wan Azha, Matsumoto (JP); Takeshi Yokoyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/728,547

(22) Filed: Dec. 27, 2019

(65) Prior Publication Data

US 2020/0267845 A1    Aug. 20, 2020

(30) Foreign Application Priority Data

Feb. 19, 2019    (JP) .............................. JP2019-027207

(51) Int. Cl.
*H01R 12/00* (2006.01)
*H05K 3/34* (2006.01)
(Continued)

(52) U.S. Cl.
CPC .............. *H05K 3/341* (2013.01); *B23K 3/04* (2013.01); *H01L 23/49811* (2013.01); *H01L 24/32* (2013.01); *H01L 24/73* (2013.01); *H01L 25/072* (2013.01); *H05K 3/301* (2013.01); *H05K 3/303* (2013.01); *H05K 3/4015* (2013.01); *H01L 2224/32245* (2013.01); *H01L 2224/48091* (2013.01); *H01L 2224/48247* (2013.01);
(Continued)

(58) Field of Classification Search
CPC ........ H05K 3/341; H05K 3/301; H05K 3/303; H05K 3/4015; H05K 2201/1031; H01L 23/49811; H01L 25/072; H01L 24/32; H01L 24/73; H01L 2224/73265; H01L 2224/32245; H01L 2224/48091; H01L 2224/48247; H01L 23/5386; H01L 21/4853; H01L 23/3735; B23K 3/04; B23K 2101/40; B23K 3/087; B23K 1/0016
USPC ......................................................... 439/83
See application file for complete search history.

(56) References Cited

U.S. PATENT DOCUMENTS 6,828,810 B2 * 12/2004 Kanamaru ........... G01R 1/0466
                                                     324/750.25
7,511,311 B2 *  3/2009 Kususe .................... H01L 24/06
                                                     257/95

(Continued)

FOREIGN PATENT DOCUMENTS

JP    S63-11168     1/1988
JP    3106374 U    1/2005
(Continued)

*Primary Examiner* — Abdullah A Riyami
*Assistant Examiner* — Nelson R. Burgos-Guntin
(74) *Attorney, Agent, or Firm* — Rabin & Berdo, P.C.

(57) ABSTRACT

A pressing area set on a main surface of a plate-shaped holding jig is arranged on contact parts. The contact parts are pressed against a multilayer board while heating the multilayer board and the pressing area of the holding jig is inclined with a warp of the multilayer board. In this way, when pressing for bonding the contact parts is performed, even if the multilayer board is warped by the heating and the contact parts are shifted, the contact parts are pressed against the multilayer board without fail.

10 Claims, 16 Drawing Sheets

(51) Int. Cl.
   *H01L 23/498* (2006.01)
   *H01L 25/07* (2006.01)
   *H05K 3/30* (2006.01)
   *H05K 3/40* (2006.01)
   *H01L 23/00* (2006.01)
   *B23K 3/04* (2006.01)
(52) U.S. Cl.
   CPC .............. *H01L 2224/73265* (2013.01); *H05K 2201/1031* (2013.01)

(56) References Cited

U.S. PATENT DOCUMENTS

| | | | | |
|---|---|---|---|---|
| 7,583,309 B2* | 9/2009 | Aizawa | ............. | H01L 27/14618 |
| | | | | 348/340 |
| 7,923,826 B2* | 4/2011 | Takahashi | ............... | H01L 24/97 |
| | | | | 257/675 |
| 7,928,553 B2* | 4/2011 | Otremba | ................. | H01L 24/97 |
| | | | | 257/687 |
| 8,238,700 B2* | 8/2012 | Asai | ......................... | G02B 6/43 |
| | | | | 385/14 |
| 8,249,402 B2* | 8/2012 | Asai | .................... | H05K 1/0274 |
| | | | | 385/14 |
| 8,664,043 B2* | 3/2014 | Ewe | ....................... | H01L 24/24 |
| | | | | 438/110 |
| 8,770,987 B2* | 7/2014 | Horikawa | ............ | H01R 12/716 |
| | | | | 439/71 |
| 9,333,736 B2* | 5/2016 | Kumakura | ............... | B26D 1/04 |
| 9,510,452 B2* | 11/2016 | Yumi | .................... | H05K 9/0026 |
| 10,008,336 B2* | 6/2018 | Kitsuda | ................ | H01G 9/2077 |
| 10,096,806 B2* | 10/2018 | Pinon | .................. | H01M 2/1077 |
| 10,354,939 B2* | 7/2019 | Yosui | ............... | H01L 23/3677 |
| 10,438,884 B2* | 10/2019 | Lee | .................. | H01L 23/49822 |
| 10,490,478 B2* | 11/2019 | Lin | ...................... | H01L 23/367 |
| 10,658,200 B2* | 5/2020 | Saita | ........................ | H01G 4/33 |
| 10,804,146 B2* | 10/2020 | Kim | ........................ | H01L 24/09 |
| 10,832,980 B2* | 11/2020 | Kisaki | .................... | H01L 23/04 |
| 2013/0114212 A1* | 5/2013 | Tada | .............. | H01B 1/026 |
| | | | | 361/712 |
| 2014/0317896 A1 | 10/2014 | Maruyama et al. | | |
| 2014/0345931 A1* | 11/2014 | Huang | ............. | H01L 23/49537 |
| | | | | 174/261 |

FOREIGN PATENT DOCUMENTS

| | | |
|---|---|---|
| JP | 2014-187179 A | 10/2014 |
| JP | 2015-091607 A | 5/2015 |

\* cited by examiner

FIG. 10

SEMICONDUCTOR DEVICE MANUFACTURING METHOD

CROSS-REFERENCE TO RELATED APPLICATION

This application is based upon and claims the benefit of priority of the prior Japanese Patent Application No. 2019-027207, filed on Feb. 19, 2019, the entire contents of which are incorporated herein by reference.

BACKGROUND OF THE INVENTION

1. Field of the Invention

The embodiments are related to a semiconductor device manufacturing method.

2. Background of the Related Art

Semiconductor devices including semiconductor elements such as insulated gate bipolar transistors (IGBTs) or power metal-oxide-semiconductor field-effect transistors (power MOSFETs) are used as power conversion devices, for example. Such a semiconductor device includes, in addition to semiconductor elements, a ceramic circuit board including an insulating layer and a plurality of circuit pattern layers, which are formed on a front surface of the insulating layer and on which the semiconductor elements are arranged. In addition, cylindrical contact parts into which external connection terminals are to be inserted are arranged on predetermined areas of the circuit pattern layers via solder.

When this semiconductor device is manufactured, first, the contact parts are arranged on the predetermined areas of the circuit pattern layers of the ceramic circuit board via the solder. Next, after a holding jig is arranged on the contact parts, the ceramic circuit board is heated to melt the solder. The solder solidifies while the holding jig is pressing the contact parts against the ceramic circuit board. Through this reflow soldering step, the contact parts are bonded to the predetermined areas of the circuit pattern layers of the ceramic circuit board via the solder (for example, see Japanese Laid-open Patent Publication No. 2014-187179).

In addition, there has been proposed a jig including: a base formed by a main body part and a frame member arranged thereon; and a plurality of positioning members arranged on the main body part and in the frame member (see Japanese Laid-open Patent Publication No. 2015-91607, for example). Top surfaces of the positioning members have holes in which electronic parts are arranged. The positioning members are sandwiched movably on the main body part of the base. Since the positioning members move on the main body part, it has not been proposed that the plurality of positioning members are arranged inclinably in the frame.

In addition, there has been proposed a soldering jig used for lead frames (see Japanese Registered Utility Model No. S63-11168, for example). A main body part is divided into a plurality of segments in a longitudinal direction, and these segments are connected via a coupling rod. In addition, between the coupling rod and the segments, clearance that allows relative movement in the longitudinal direction of the main body part is provided. A jig is divided to reduce the impact of a warp of the jig caused at the time of heating.

In the case of the above ceramic circuit board, a metal layer is formed on a rear surface of the insulating layer, and the metal layer has a larger area than those of the circuit pattern layers formed on the front surface of the insulating layer. Thus, when the ceramic circuit board having constitutional elements whose thermal expansion rates are different from each other is heated in the reflow soldering step, the ceramic circuit board is warped in a downward convex shape (in the direction of the gravitational force). When the holding jig presses the contact parts on the warped ceramic circuit board, since there is a gap between the holding jig and the contact parts, the holding jig is unable to appropriately press the contact parts against the ceramic circuit board. As a result, the contact parts could not be bonded to the ceramic circuit board, and the quality of the semiconductor device could be deteriorated.

SUMMARY

In one aspect of the embodiments, there is provided a semiconductor device manufacturing method including: preparing a multilayer board and a plurality of contact parts, the multilayer board including an insulating layer, a circuit pattern layer formed on a front surface of the insulating layer, and a metal layer formed on a rear surface of the insulating layer and having an area larger than an area of the circuit pattern layer in a plan view of the multilayer board; arranging each of the plurality of contact parts on the circuit pattern layer of the multilayer board via a bonding material; arranging a pressing area of a main surface of a plate-shaped holding jig on the plurality of contact parts; and while heating the multilayer board, pressing the plurality of contact parts against the multilayer board by inclining the pressing area of the holding jig to conform to a warp of the multilayer board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 10 is a plan view for illustrating a step of setting contact parts by using the part positioning jig in the semiconductor device manufacturing method according to the second embodiment;

DETAILED DESCRIPTION OF THE INVENTION

First Embodiment

Figure 1A:
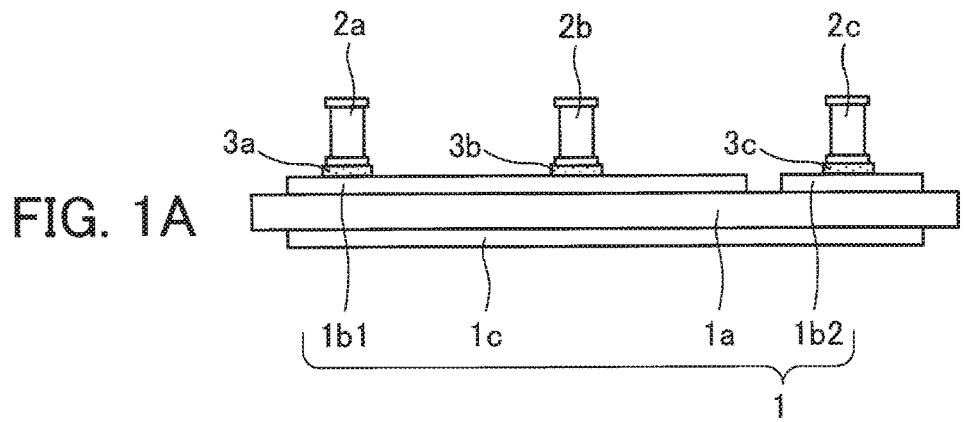
FIGS. 1A to 1D illustrate steps in a semiconductor device manufacturing method according to a first embodiment.
Figure 1B:
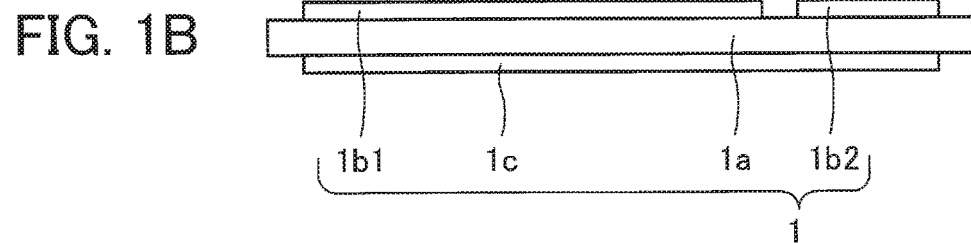
Figure 1C:
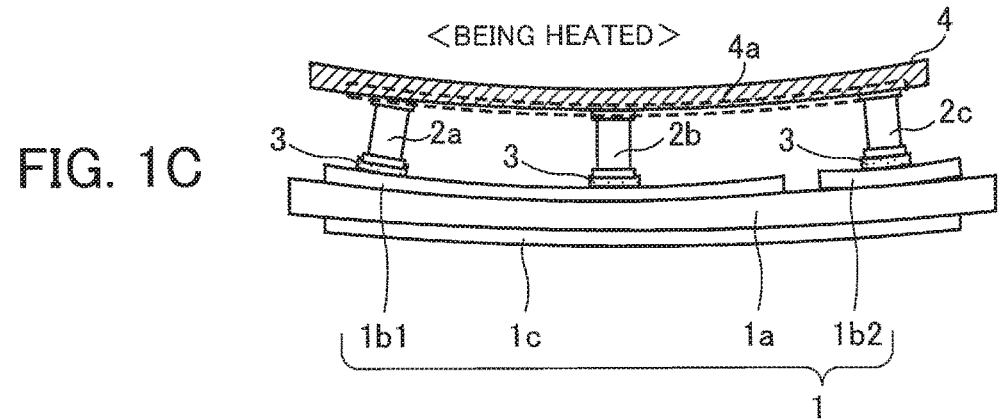
Figure 1D:
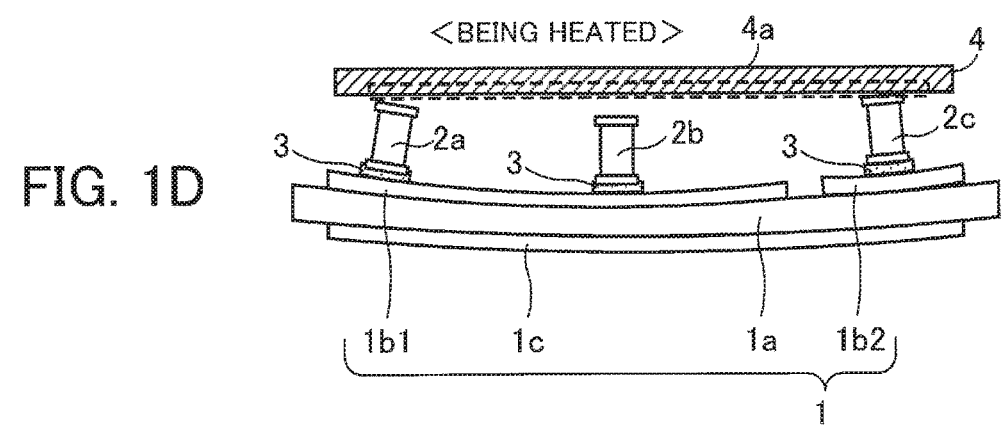

Hereinafter, a semiconductor device manufacturing method according to a first embodiment will be described with reference to FIGS. 1A to 1D. FIGS. 1A to 1D are drawings for illustrating steps of a semiconductor device manufacturing method according to a first embodiment. Among the steps of the semiconductor device manufacturing method, FIGS. 1A to 1C illustrate side views of steps relating to a reflow soldering step in chronological order. FIG. 1D illustrates a reference example with respect to the step in FIG. 1C.

First, a multilayer board 1 and a plurality of contact parts 2a to 2c are prepared. The multilayer board 1 includes an insulating layer 1a, circuit pattern layers 1b1 and 1b2 that are formed on a front surface of the insulating layer 1a, and a metal layer 1c that is formed on a rear surface of the insulating layer 1a and that has a larger area than those of the circuit pattern layers 1b1 and 1b2. The insulating layer 1a, the circuit pattern layers 1b1 and 1b2, and the metal layer 1c of the multilayer board 1 have different thermal expansion rates. In addition, for example, each of the contact parts 2a to 2c has a cylindrical shape, and a through-hole is formed therein. A pin external connection terminal (not illustrated) is inserted into each of these contact parts 2a to 2c.

Bonding material 3a to 3c is applied onto the circuit pattern layers 1b1 and 1b2 of the multilayer board 1, and the contact parts 2a to 2c are arranged on the bonding material 3a to 3c, respectively (FIG. 1A).

Next, as a pre-pressing step, a pressing area 4a set on a main surface of a plate-shaped holding jig 4 is arranged on the contact parts 2a to 2c arranged on the circuit pattern layers 1b1 and 1b2 of the multilayer board 1 (FIG. 1B).

Next, in this state, the holding jig 4 is pressed against the multilayer board 1 while being heated as a pressing step. When heated, the multilayer board 1 is warped in a downward convex shape (in the direction of the gravitational force) due to the difference among the thermal expansion rates of the insulating layer 1a, the circuit pattern layers 1b1 and 1b2, and the metal layer 1c. The pressing area 4a of the holding jig 4 is also inclined with the warp of the multilayer board 1. In this way, even when the contact parts 2a to 2c arranged on the warped multilayer board 1 are shifted, since the pressing area 4a moves with the warp of the multilayer board 1, the holding jig 4 is able to appropriately press the contact parts 2a to 2c against the multilayer board 1 (FIG. 1C).

The following description will be made on a case in which the pressing step is performed without moving the pressing area 4a of the holding jig 4 with the warp of the multilayer board 1. As illustrated in FIG. 1D, when the multilayer board 1 is warped, the contact parts 2a to 2c arranged thereon are shifted. Namely, the holding jig 4 is not able to appropriately press the contact parts 2a to 2c against the multilayer board 1. In addition, since a gap is formed between the contact part 2b and the holding jig 4, the holding jig 4 is unable to press the contact part 2b.

As described above, according to the semiconductor device manufacturing method, first, there are prepared: the multilayer board 1 including the insulating layer 1a, the circuit pattern layers 1b1 and 1b2 that are formed on the front surface of the insulating layer 1a, and the metal layer 1c that is formed on the rear surface of the insulating layer 1a and that has a larger area than those of the circuit pattern layers 1b1 and 1b2; and the plurality of contact parts 2a to 2c. Next, the contact parts 2a to 2c are arranged on the circuit pattern layers 1b1 and 1b2 of the multilayer board 1 via the bonding material 3a to 3c. Next, the pressing area 4a set on the main surface of the plate-shaped holding jig 4 is arranged on the contact parts 2a to 2c. Next, while being heated, the pressing area 4a of the holding jig 4 is inclined with the warp of the multilayer board 1, and the contact parts 2a to 2c are pressed against the multilayer board 1. As a result, when the pressing for the bonding of the contact parts 2a to 2c is performed, even if the multilayer board 1 is warped by the heating and the contact parts 2a to 2c are shifted, the contact parts 2a to 2c are pressed against the multilayer board 1 without fail.

Second Embodiment

Figure 2:
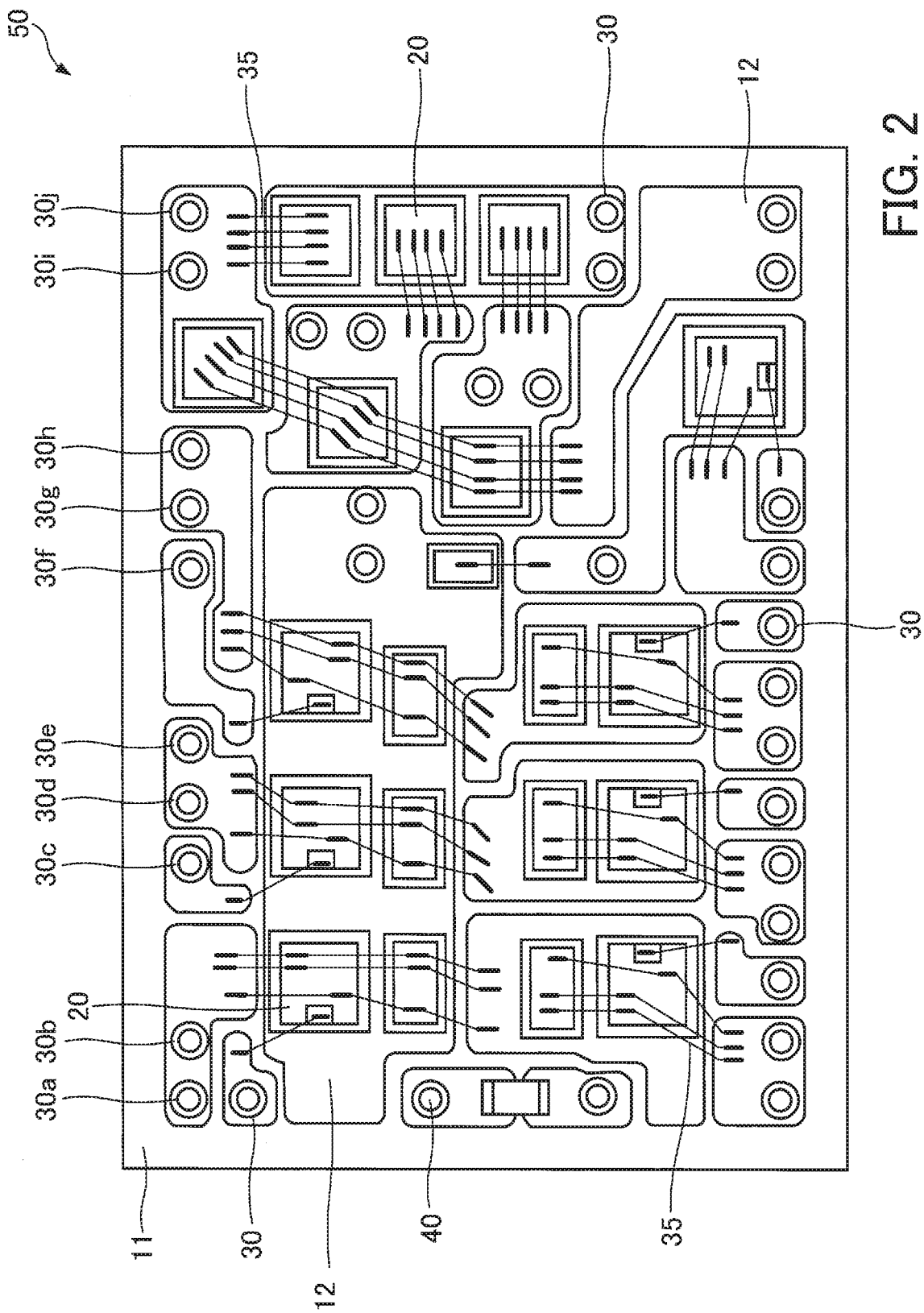
FIG. 2 is a plan view of a semiconductor device according to a second embodiment.
Figure 3:
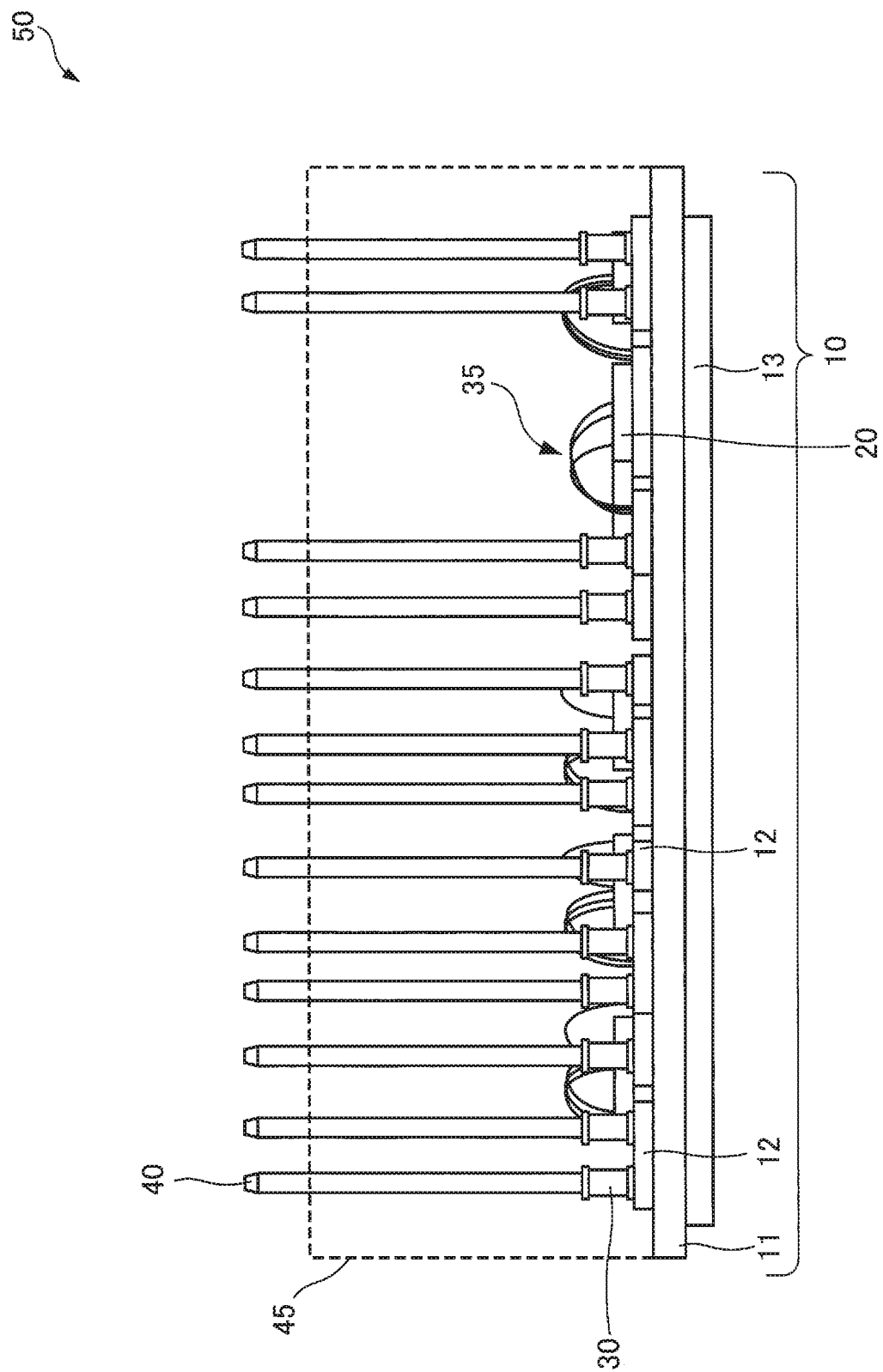
FIG. 3 is a side view of the semiconductor device according to the second embodiment.

In a second embodiment, the semiconductor device manufacturing method according to the first embodiment will be described in more detail. First, a semiconductor device 50 will be described with reference to FIGS. 2 and 3. FIG. 2 is a plan view of the semiconductor device 50 according to the second embodiment, and FIG. 3 is a side view of the semiconductor device 50 according to the second embodiment. While sealing material 45 is not illustrated in FIG. 2, the sealing material 45 is illustrated by a dashed line in FIG. 3. In addition, in the second embodiment, a plurality of circuit pattern layers 12, a plurality of semiconductor elements 20, a plurality of contact parts 30, a plurality of bonding wires 35, and a plurality of external connection terminals 40 will be described, and the same kind of elements will be denoted and described by the same reference character, without distinguishing these elements from each other. The same holds true for other kinds of elements, each of which is provided in plurality. However, some of the contact parts 30 will be described as contact parts 30a to 30j.

Figure 4:
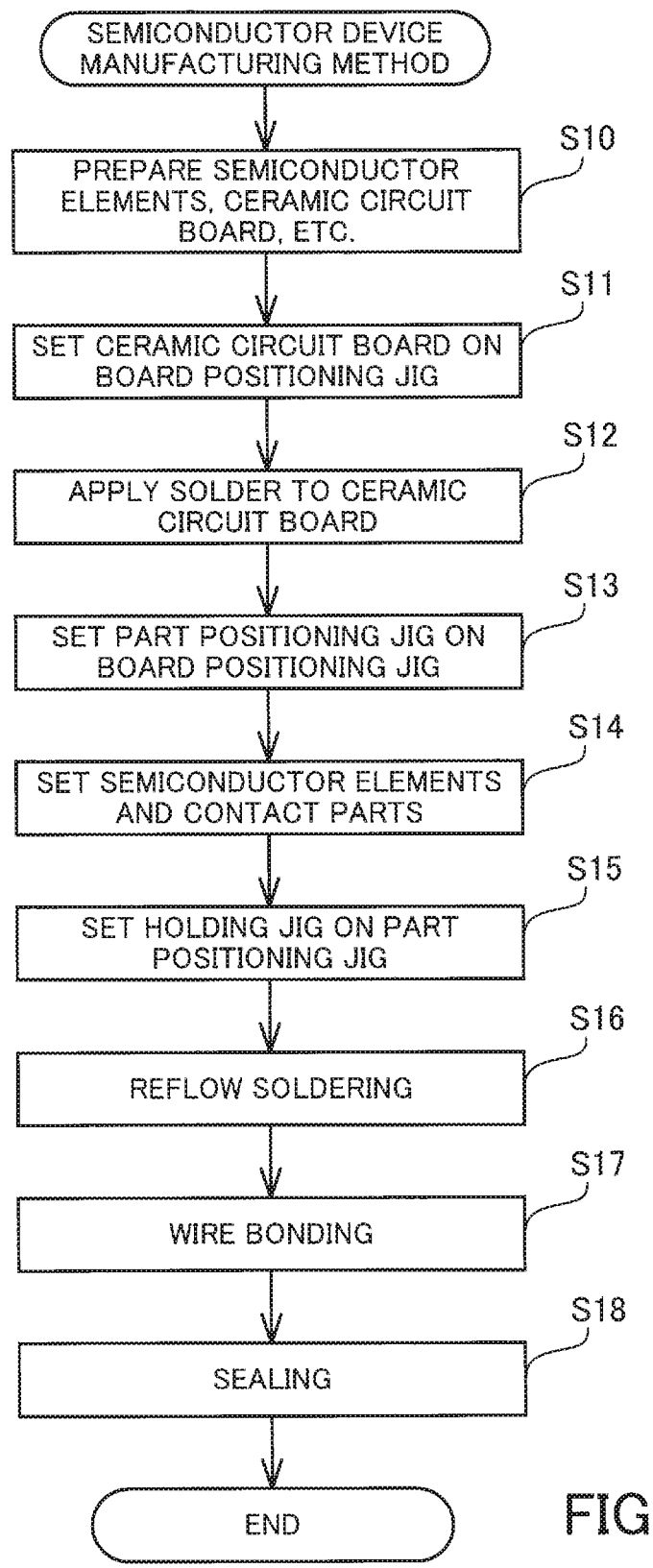
FIG. 4 is a flowchart illustrating a semiconductor device manufacturing method according to the second embodiment.

As illustrated in FIGS. 3 and 4, the semiconductor device 50 includes a ceramic circuit board 10 (a multilayer board) and the semiconductor elements 20 bonded to a front surface of the ceramic circuit board 10. The semiconductor device 50 includes the contact parts 30 and 30a to 30j bonded to the front surface of the ceramic circuit board 10. In addition, the semiconductor device 50 includes the bonding wires 35 that electrically connect the front surface of the ceramic circuit board 10 and main electrodes of the semiconductor elements 20. In addition, the external connection terminals 40 are pressed and attached into the contact parts 30 and 30a to 30j. The semiconductor device 50, including the semiconductor elements 20 on the front surface of the ceramic circuit board 10, is sealed by the sealing material 45 in such a manner that ends of the external connection terminals 40 attached into the contact parts 30 and 30a to 30j protrude. Hereinafter, when the contact parts 30 and 30a to 30j do not need to be distinguished from each other, an individual one of these contact parts will be referred to as a contact part 30.

The ceramic circuit board 10 includes an insulating layer 11, the plurality of circuit pattern layers 12 formed on a front surface of the insulating layer 11, and a metal layer 13 formed on a rear surface of the insulating layer 11. The insulating layer 11 is made of ceramic material having high thermal conductivity, such as aluminum oxide, aluminum nitride, or silicon nitride having excellent thermal conductivity. The plurality of circuit pattern layers 12 are made of material having excellent electrical conductivity. For example, the circuit pattern layers 12 are made of silver, copper, nickel, or an alloy containing at least one kind of these elements. The metal layer 13 is made of metal material having excellent thermal conductivity, such as aluminum, iron, silver, copper, or an alloy containing at least one kind of these elements.

For example, a direct copper bonding (DCB) board or an active metal brazed (AMB) board may be used as the ceramic circuit board 10 having the above configuration. The heat radiation performance may be improved by attaching a cooler (not illustrated) to the metal layer 13 of the ceramic circuit board 10 via thermal grease such as silicone mixed with metal oxide filler. In this case, for example, the cooler is made of material having excellent thermal conductivity, such as aluminum, iron, silver, copper, or an alloy containing at least one kind of these elements. In addition, a fin, a heatsink including a plurality of fins, a water-cooling cooling device, or the like may be used as the cooler. In addition, a heat radiation board may be formed integrally with the cooler. In this case, the heat radiation board is made of material having excellent thermal conductivity, such as aluminum, iron, silver, copper, or an alloy containing at least one kind of these elements. In addition, for example, material such as nickel may be formed on a surface of the heat radiation board integrally formed with the cooler by plate processing or the like, to improve the corrosion resistance. Specifically, other than nickel, a nickel-phosphorus alloy, a nickel-boron alloy, or the like may be used as the material.

For example, the insulating layer 11 has a rectangular shape in a planar view. The metal layer 13 also has a rectangular shape in a planar view and has an area smaller than that of the insulating layer 11 and larger than the total area of the circuit pattern layers 12. Namely, the ceramic circuit board 10 has a rectangular shape, for example.

For example, the semiconductor elements include switching elements such as IGBTs or power MOSFETs made of silicon or silicon carbide. An individual semiconductor element 20 includes, for example, a drain electrode (or a collector electrode) as a main electrode on its rear surface and a gate electrode and a source electrode (or an emitter electrode) as main electrodes on its front surface. In addition, an individual semiconductor element 20 includes, as needed, a diode such as a Schottky barrier diode (SBD) or a freewheeling diode (FWD). An individual semiconductor element 20 includes a cathode electrode as a main electrode on its rear surface and an anode electrode as a main electrode on its front surface. The rear surface of the individual semiconductor element 20 is bonded to a predetermined circuit pattern layer (not illustrated). The semiconductor elements 20 are bonded to the circuit pattern layers 12 via solder (not illustrated). The solder will be described below. While not illustrated, for example, lead frames, external connection terminals (pin terminals, contact parts, or the like), electronic parts (thermistors, current sensors), or the like may be arranged in place of the semiconductor elements 20, as needed.

The bonding wires 35 are made of material having excellent electrical conductivity. For example, the bonding wires 35 are made of gold, silver, copper, aluminum, or an alloy containing at least one kind of these elements. In addition, the diameter of each of the bonding wires 35 that electrically connect the gate electrodes of the semiconductor elements 20 and the circuit pattern layers 12 is 110 µm or more and 130 µm or less, and the average is 125 µm, for example. The diameter of each of the other bonding wires 35 is 350 µm or more and 450 µm or less, and the average is 400 µm, for example.

The sealing material 45 includes, for example, thermoset resin such as maleimide-modified epoxy resin, maleimide-modified phenolic resin, or maleimide resin and filler contained in the thermoset resin. For example, the sealing material 45 includes epoxy resin and material such as silicon dioxide, aluminum oxide, boron nitride, or aluminum nitride included in the epoxy resin as filler.

Figure 5:
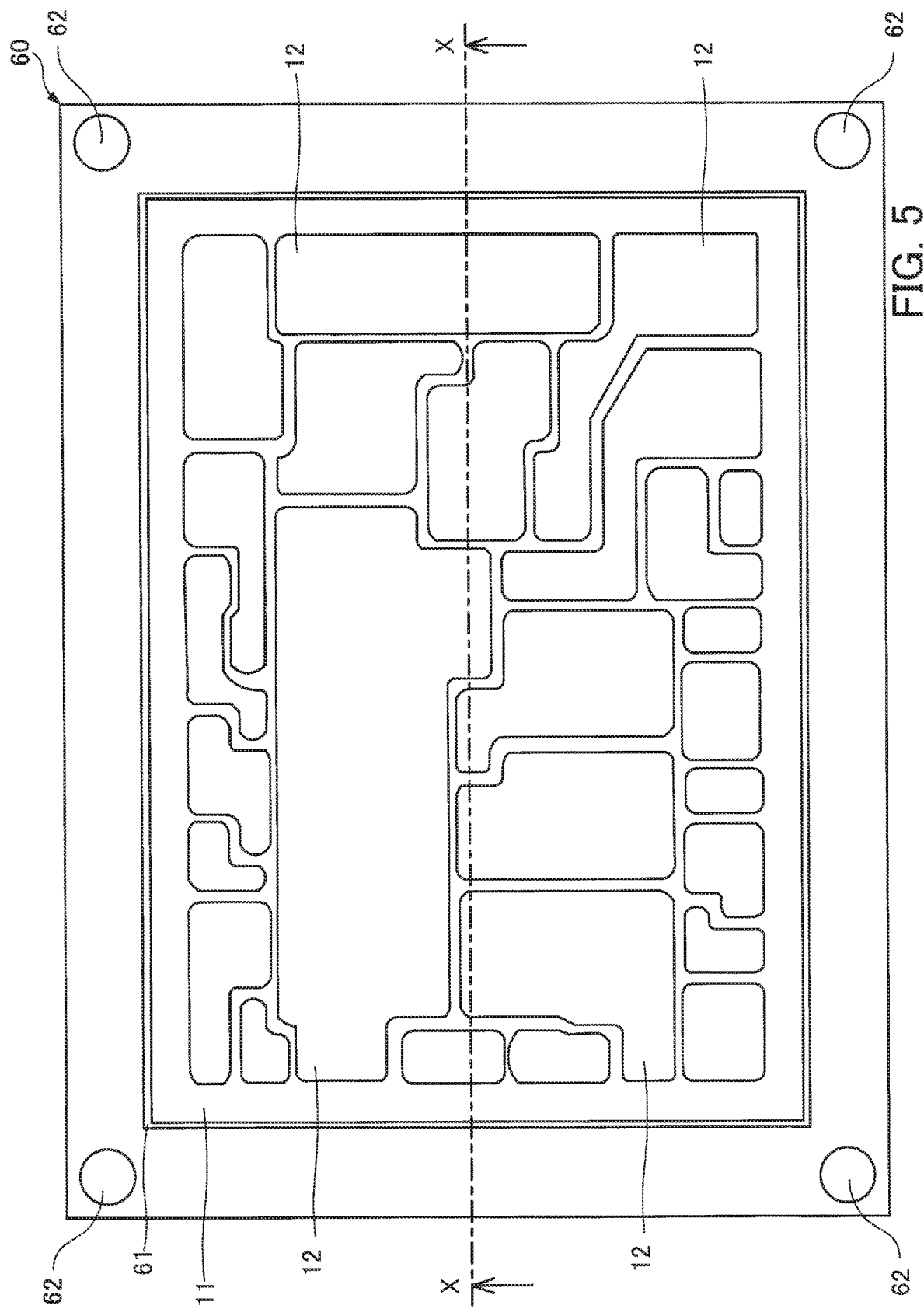
FIG. 5 is a plan view for illustrating a step of setting a ceramic circuit board on a board positioning jig in the semiconductor device manufacturing method according to the second embodiment.
Figure 6:
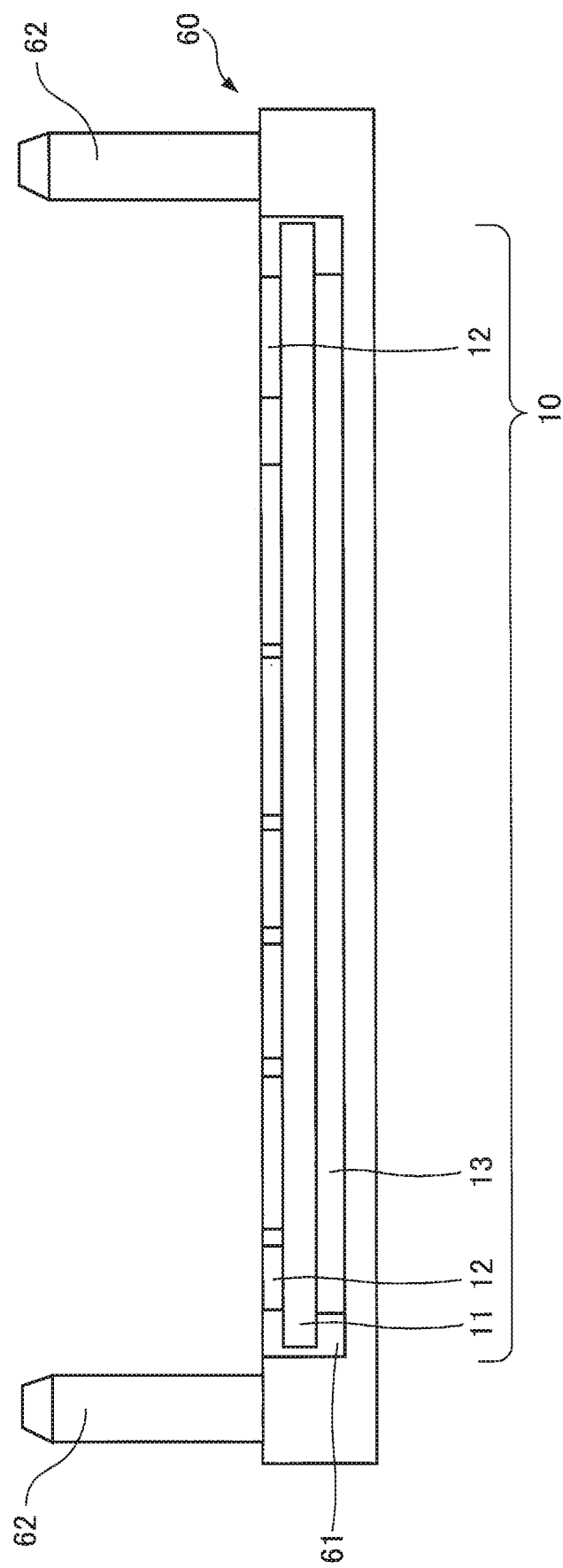
FIG. 6 is a sectional view for illustrating the step of setting the ceramic circuit board on the board positioning jig in the semiconductor device manufacturing method according to the second embodiment.

Next, a manufacturing method of the semiconductor device 50 will be described in accordance with a flowchart illustrated in FIG. 4 and by using FIGS. 5 to 16 illustrating various steps and jigs. FIG. 4 is a flowchart illustrating a semiconductor device manufacturing method according to the second embodiment. FIG. 5 is a plan view for illustrating a step of setting the ceramic circuit board on a board positioning jig in the semiconductor device manufacturing method according to the second embodiment. FIG. 6 is a sectional view for illustrating the step of setting the ceramic circuit board on the board positioning jig in the semiconductor device manufacturing method according to the second embodiment.

Figure 7:
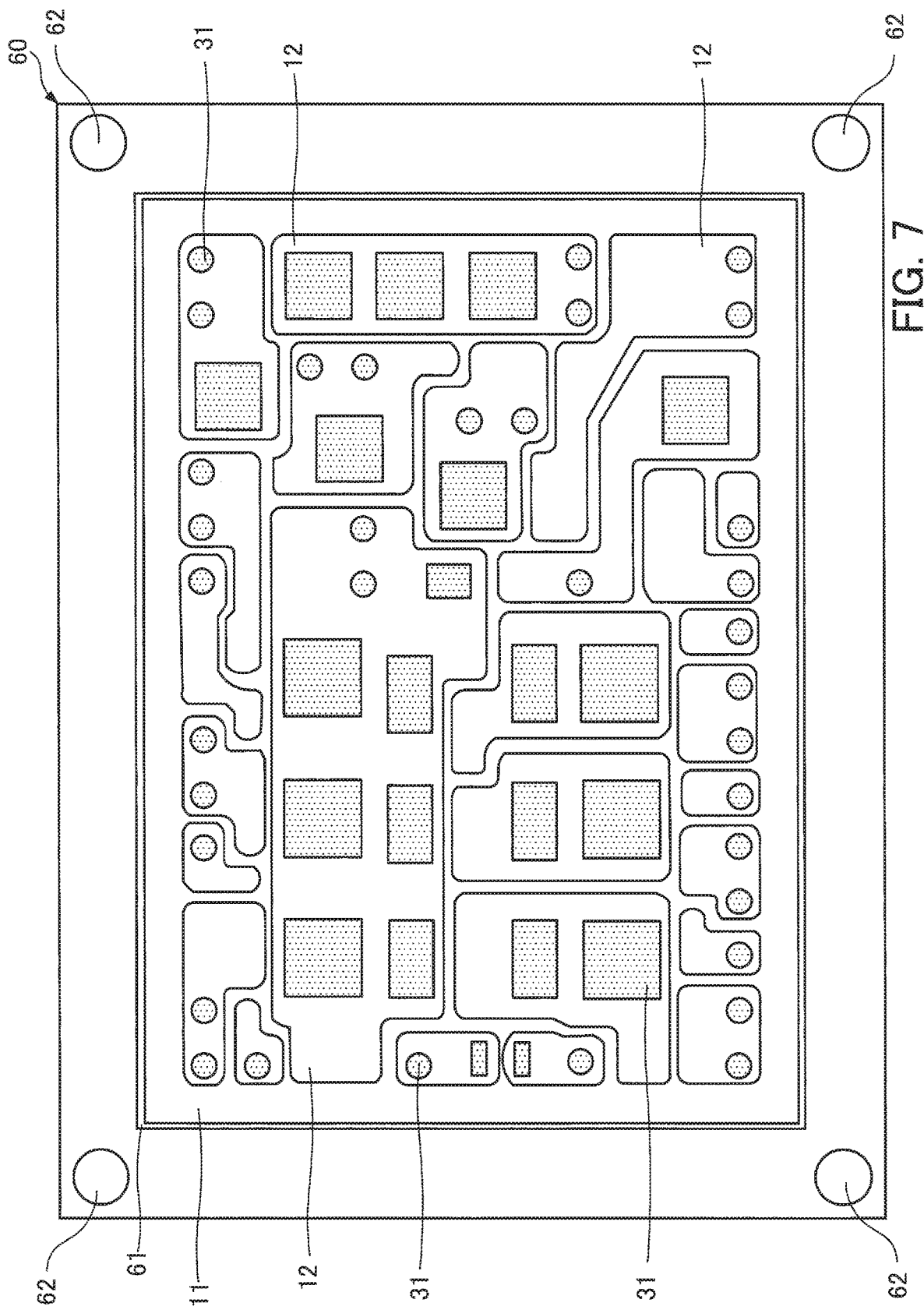
FIG. 7 is a plan view for illustrating a step of applying solder to the ceramic circuit board in the semiconductor device manufacturing method according to the second embodiment.
Figure 8:
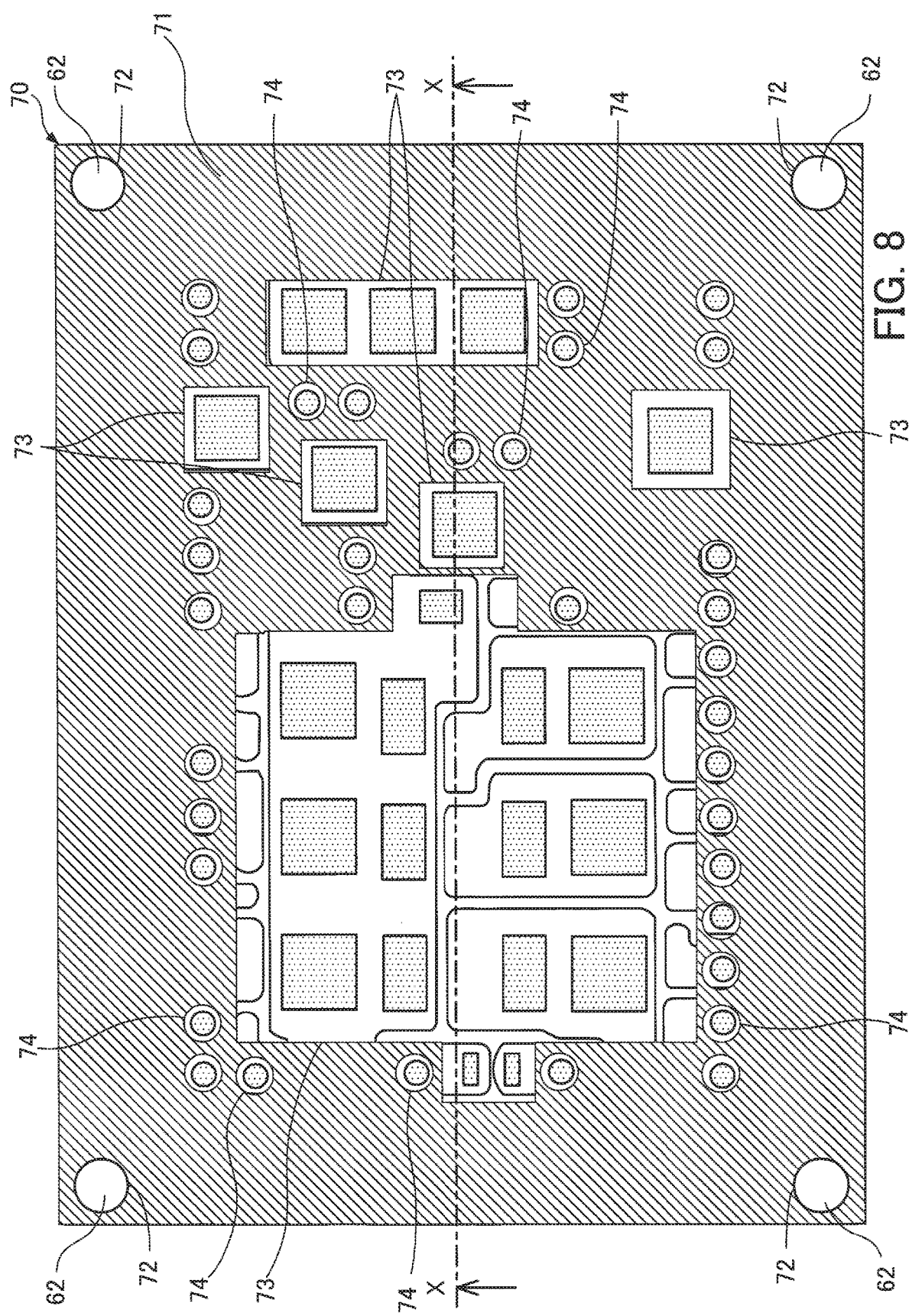
FIG. 8 is a plan view for illustrating a step of setting a part positioning jig in the semiconductor device manufacturing method according to the second embodiment.
Figure 9:
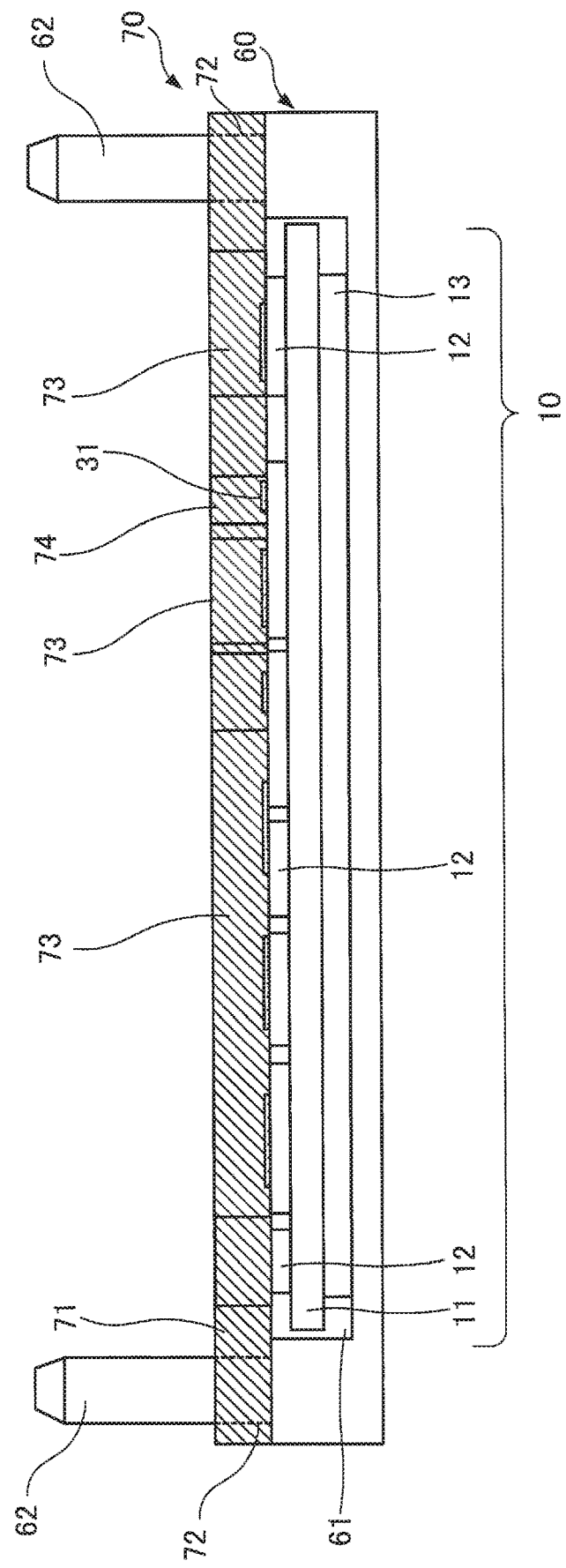
FIG. 9 is a sectional view for illustrating the step of setting the part positioning jig in the semiconductor device manufacturing method according to the second embodiment.

FIG. 7 is a plan view for illustrating a step of applying solder to the ceramic circuit board in the semiconductor device manufacturing method according to the second embodiment. FIG. 8 is a plan view for illustrating a step of setting a part positioning jig in the semiconductor device manufacturing method according to the second embodiment. FIG. 9 is a sectional view for illustrating the step of setting the part positioning jig in the semiconductor device manufacturing method according to the second embodiment.

Figure 10:
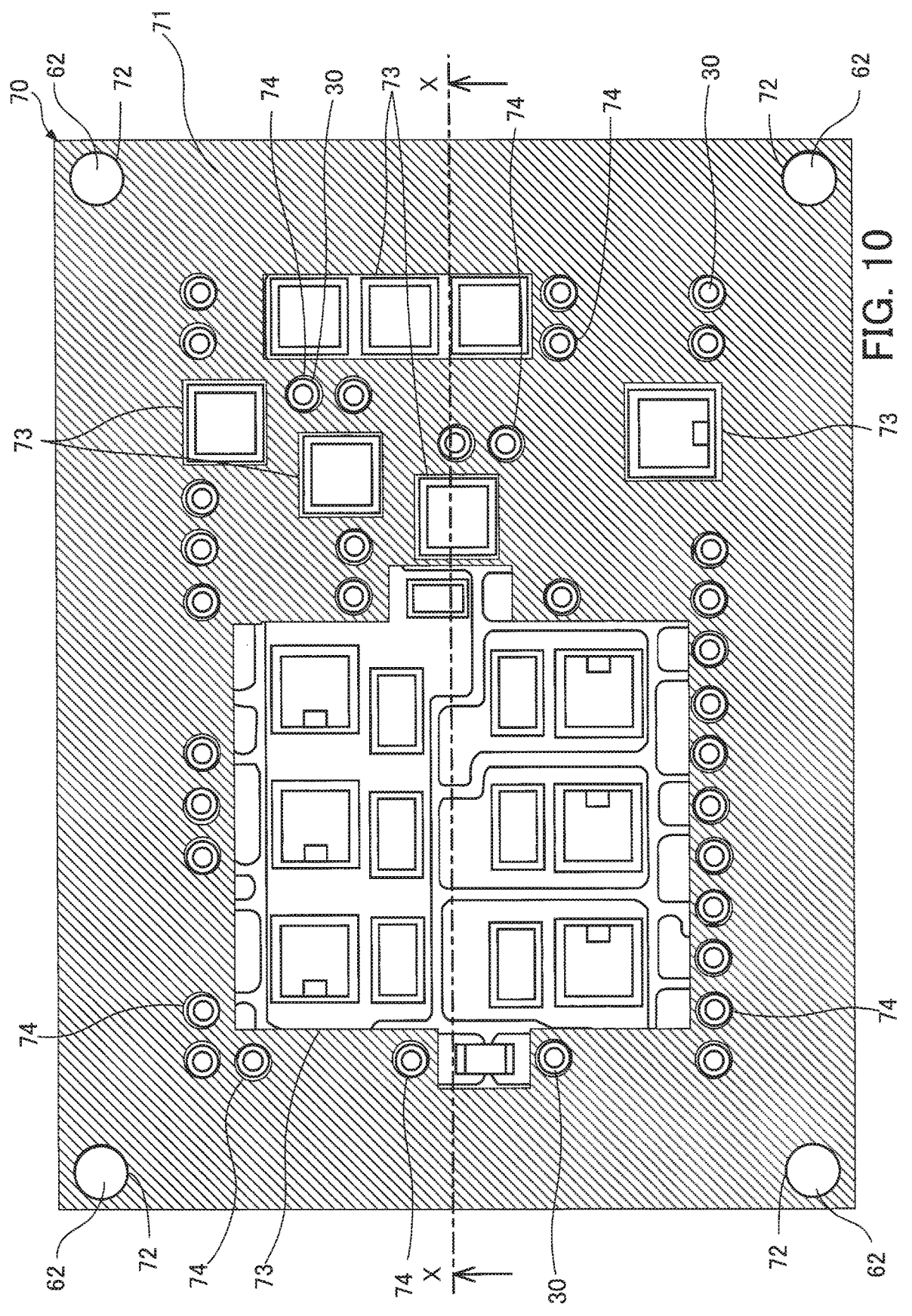
Figure 11:
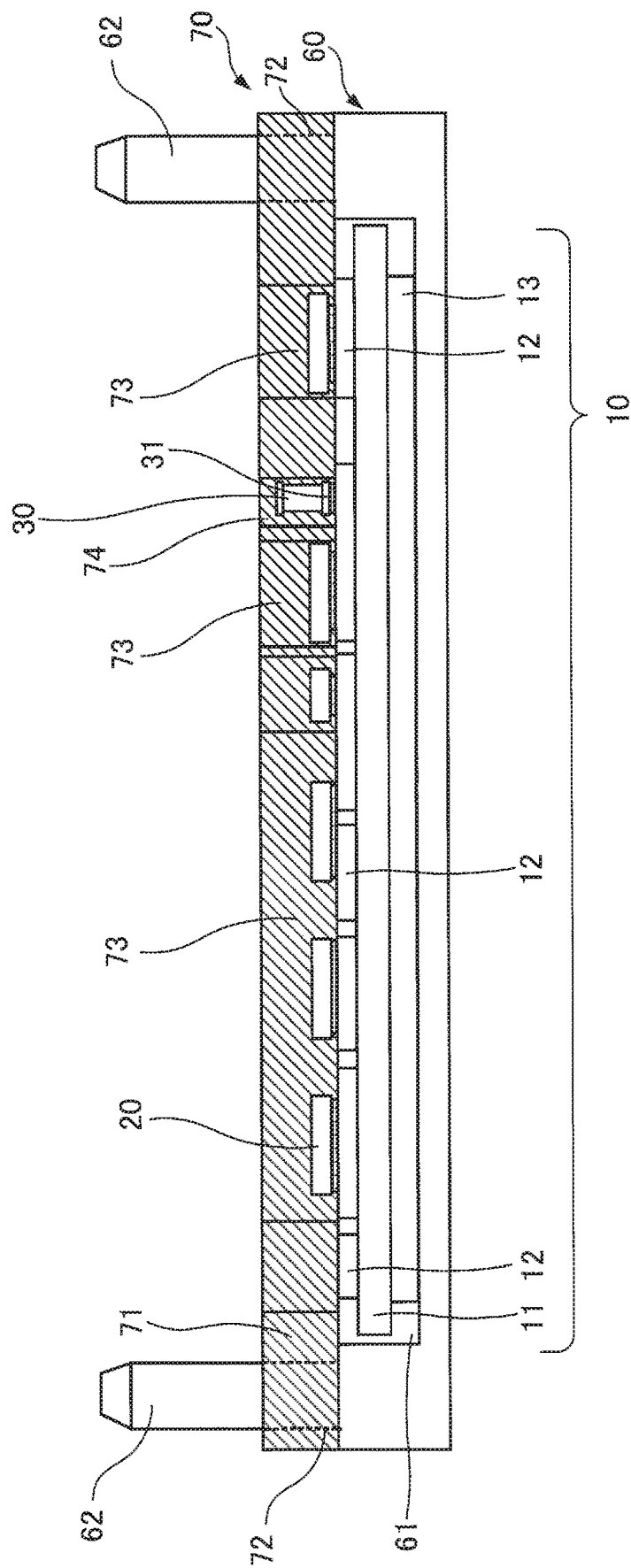
FIG. 11 is a sectional view for illustrating the step of setting the contact parts by using the part positioning jig in the semiconductor device manufacturing method according to the second embodiment.

FIG. 10 is a plan view for illustrating a step of setting the contact parts by using the part positioning jig in the semiconductor device manufacturing method according to the second embodiment. FIG. 11 is a sectional view for illustrating the step of setting the contact parts by using the part positioning jig in the semiconductor device manufacturing method according to the second embodiment.

Figure 12:
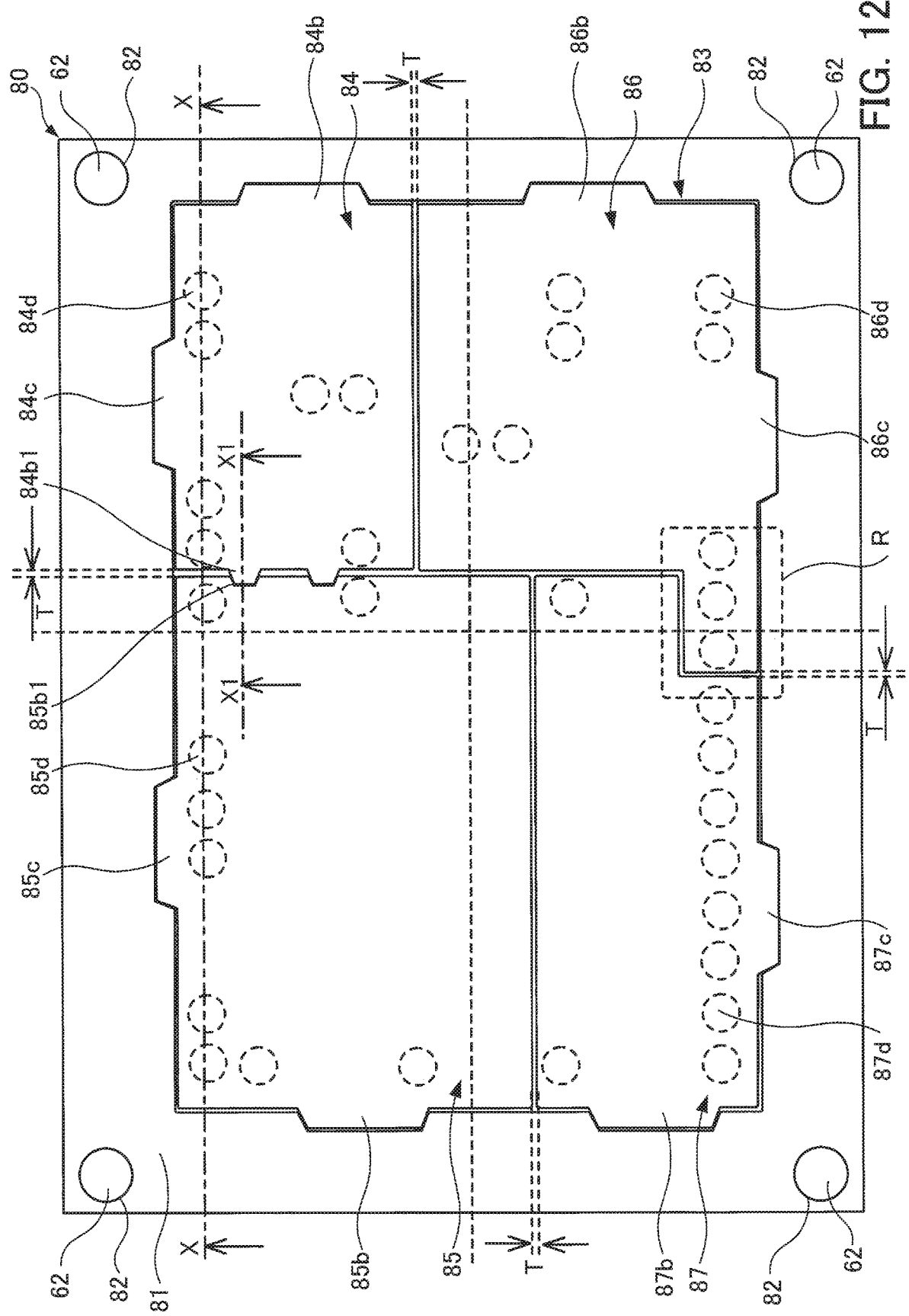
FIG. 12 is a plan view for illustrating a step of setting a holding jig in the semiconductor device manufacturing method according to the second embodiment.
Figure 13:
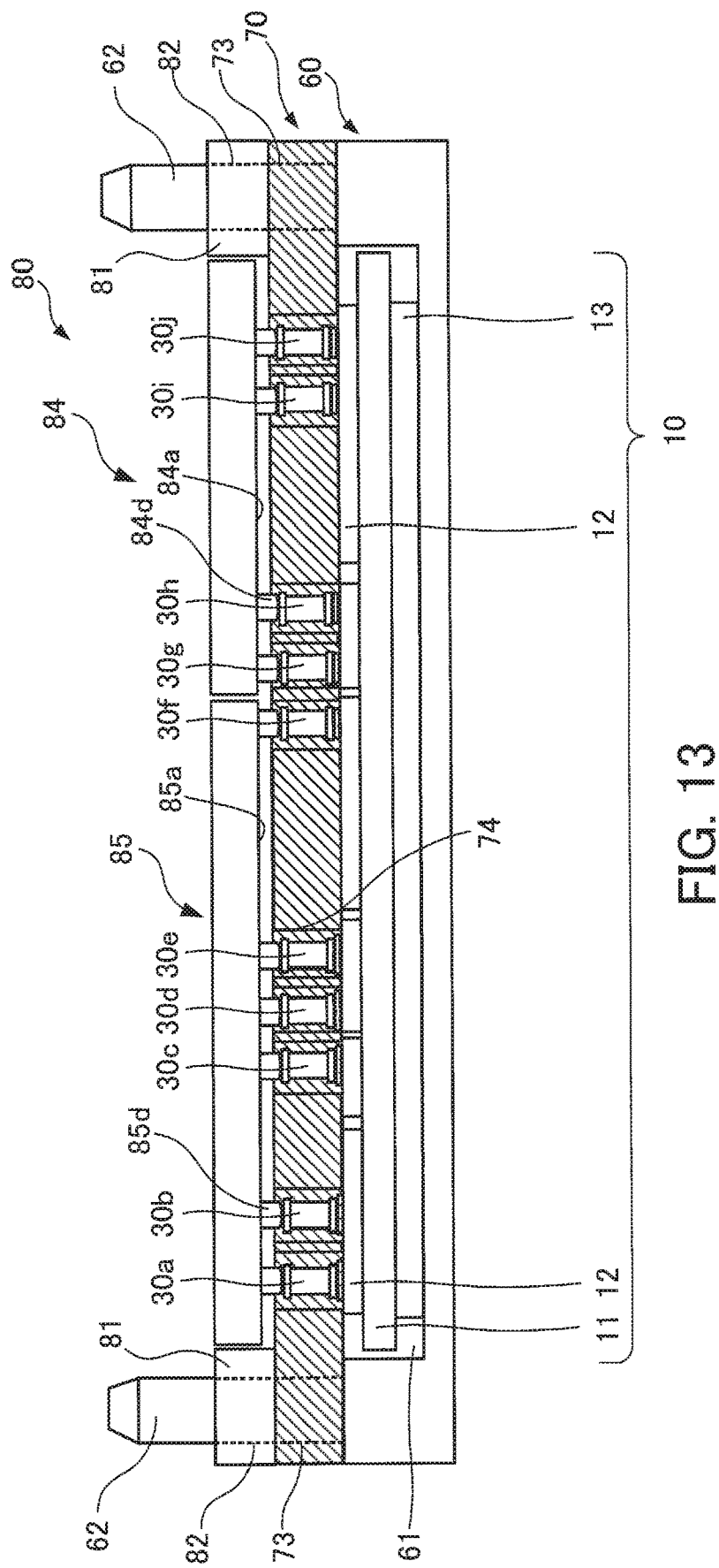
FIG. 13 is a sectional view for illustrating the step of setting the holding jig in the semiconductor device manufacturing method according to the second embodiment.

FIG. 12 is a plan view for illustrating a step of setting a holding jig in the semiconductor device manufacturing method according to the second embodiment. FIG. 13 is a sectional view for illustrating the step of setting the holding jig in the semiconductor device manufacturing method according to the second embodiment.

Figure 14:
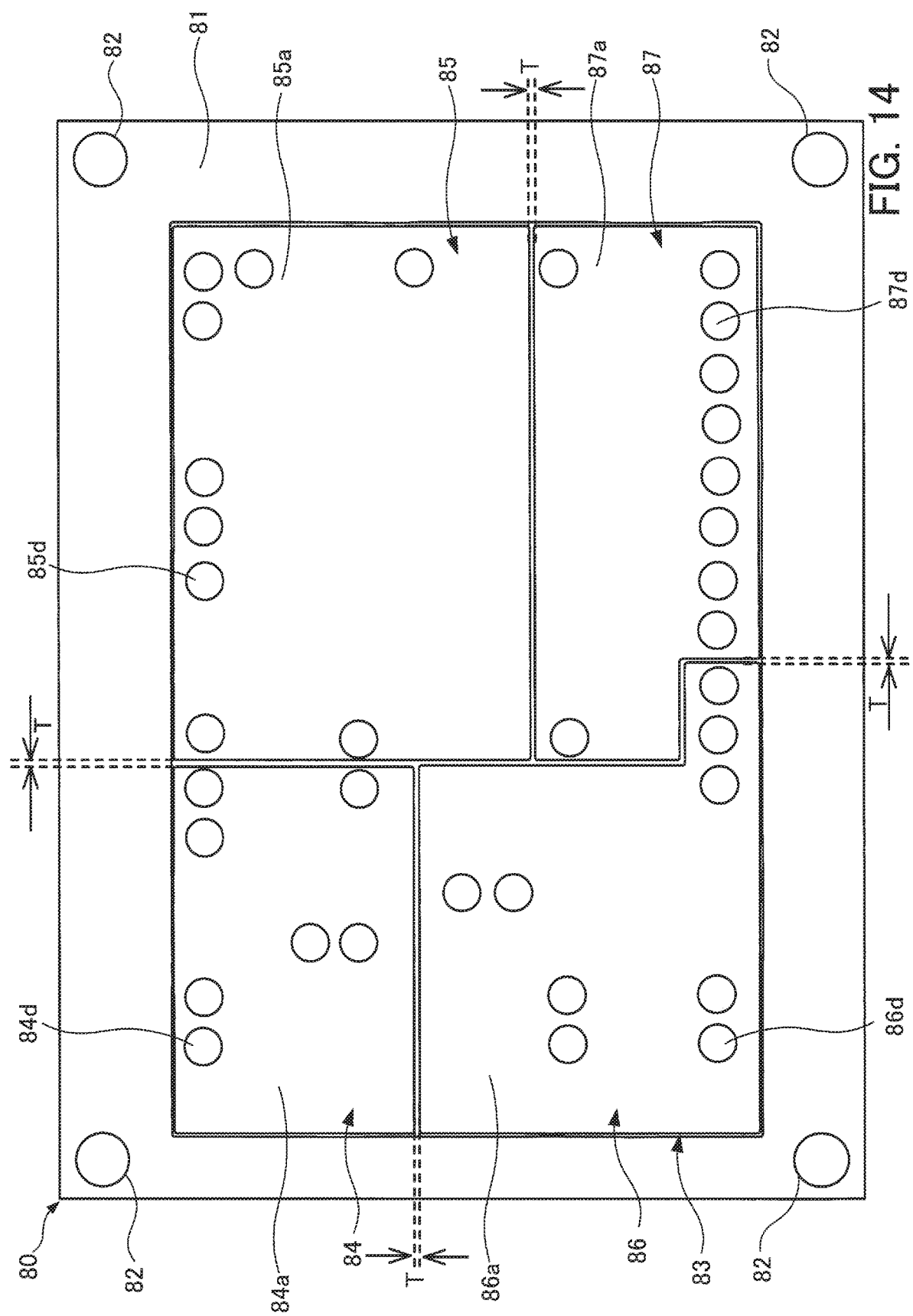
FIG. 14 is a plan view of the holding jig used in the semiconductor device manufacturing method according to the second embodiment.
Figure 15:
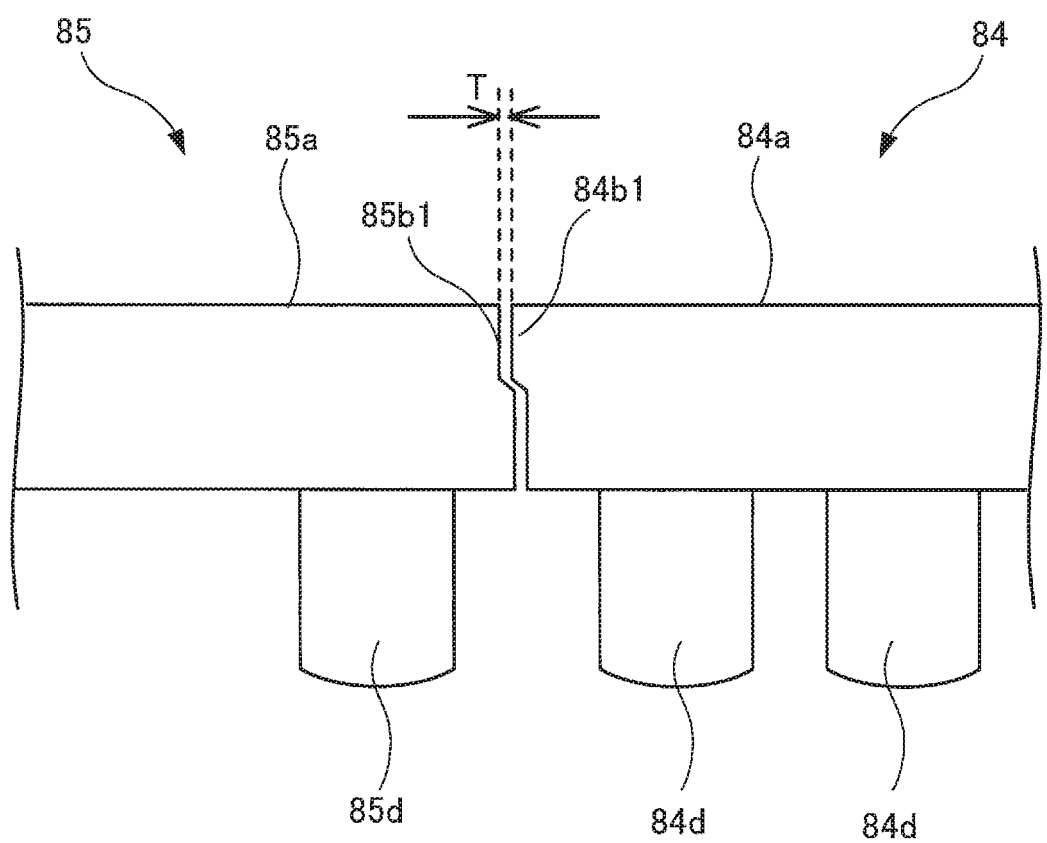
FIG. 15 is a sectional view of a main part of the holding jig used in the semiconductor device manufacturing method according to the second embodiment.
Figure 16:
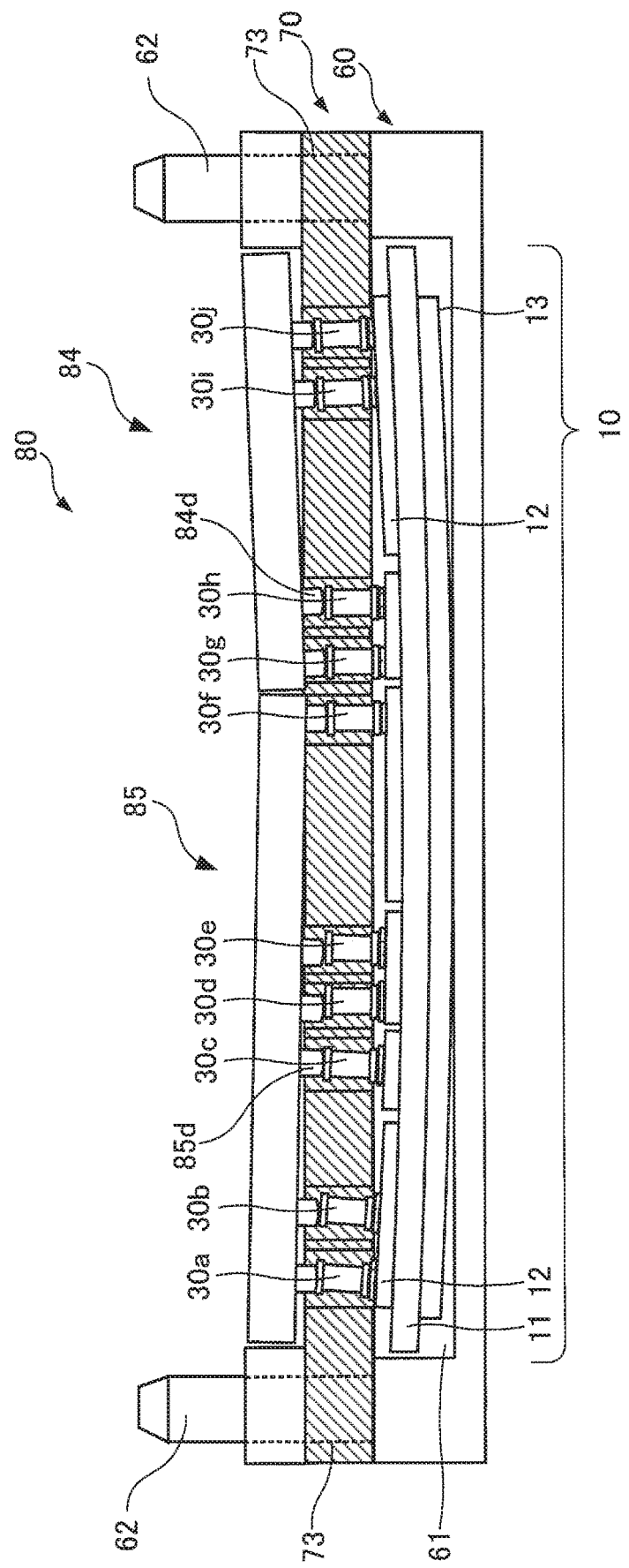
FIG. 16 is a sectional view for illustrating a reflow soldering step using the holding jig in the semiconductor device manufacturing method according to the second embodiment.

FIG. 14 is a plan view of the holding jig used in the semiconductor device manufacturing method according to the second embodiment. FIG. 15 is a sectional view of a main part of the holding jig used in the semiconductor device manufacturing method according to the second embodiment. FIG. 16 is a sectional view for illustrating a reflow soldering step using the holding jig in the semiconductor device manufacturing method according to the second embodiment. FIG. 14 is a plan view of a surface of the holding jig 80 set on the part positioning jig 70, the surface facing the part positioning jig 70. FIGS. 6, 9, 11, and 13 are sectional views taken along an alternate long and short dash line X-X in FIGS. 5, 8, 10, and 12. In addition, FIG. 15 is a sectional view taken along an alternate long and short dash line X1-X1 in FIG. 12.

The semiconductor device 50 is manufactured in accordance with the following manufacturing steps (flowchart). The following manufacturing steps are performed manually or a manufacturing apparatus, as needed.

[Step S10] The semiconductor elements 20, the ceramic circuit board 10, and the contact parts 30 are prepared. Other than the above parts, parts needed to manufacture the semiconductor device 50 are prepared.

[Step S11] As illustrated in FIGS. 5 and 6, the ceramic circuit board 10 is set on a board positioning jig 60. The board positioning jig 60 has a rectangular shape in a planar view, and a concave storage portion 61 in which the ceramic circuit board 10 is stored is formed in the middle of the board positioning jig 60. The board positioning jig 60 has guide pins 62 at the four corners on its top surface. In addition, the board positioning jig 60 is made of material having excellent heat resistance, such as composite ceramic material or carbon. The ceramic circuit board 10 is set in the storage portion 61 of the board positioning jig 60 with the circuit pattern layers 12 facing up.

[Step S12] As illustrated in FIG. 7, solder 31 is applied to areas where the semiconductor elements 20 and the contact parts 30 are arranged, the areas being on the circuit pattern layers 12 of the ceramic circuit board 10 stored in the storage portion 61 of the board positioning jig 60. The solder 31 may be applied to the circuit pattern layers 12 of the ceramic circuit board 10 by screen printing, for example. In FIG. 7, the solder 31 corresponding to the semiconductor elements 20 is denoted by rectangles, and the solder 31 corresponding to the contact parts 30 is denoted by circles.

In addition, for example, the solder 31 is lead-free solder including at least one of a tin-silver-copper alloy, a tin-zinc-bismuth alloy, a tin-copper alloy, and a tin-silver-indium-bismuth alloy as a main component. In addition to the alloy, the solder 31 includes flux that removes oxides on the circuit pattern layers 12. For example, the flux contains epoxy resin, carboxylic acid, rosin resin, activator, or solvent and may additionally contain other components, as needed. An additive such as nickel, germanium, cobalt, or silicon may be contained additionally in the solder 31.

[Step S13] As illustrated in FIGS. 8 and 9, the part positioning jig 70 is set on the board positioning jig 60. The part positioning jig 70 is also made of material having excellent heat resistance, such as composite ceramic material or carbon. The part positioning jig 70 has a plate-like shape which is rectangular in a planar view. Guide holes 72 are formed in the four corners of the part positioning jig 70. The part positioning jig 70 is set on the board positioning jig 60 when the guide holes 72 are engaged with the guide pins 62 of the board positioning jig 60. The part positioning jig 70 has element guide portions 73 and contact guide portions 74 as openings. As described above, when the part positioning jig 70 is set on the board positioning jig 60, the element guide portions 73 and the contact guide portions 74 face (the solder 31 applied to) the areas where the contact parts 30 and the semiconductor elements 20 of the ceramic circuit board 10 are arranged. The element guide portions 73 and the contact guide portions 74 are formed to be slightly larger than the semiconductor elements 20 and the contact parts 30.

[Step S14] As illustrated in FIGS. 10 and 11, the semiconductor elements 20 and the contact parts 30 are set in the element guide portions 73 and the contact guide portions of the part positioning jig 70 by using a mounting apparatus (not illustrated).

[Step S15] As illustrated in FIGS. 12 and 13, the holding jig 80 is set on the part positioning jig 70. Hereinafter, the holding jig 80 will be described with reference to FIGS. 12 to 15. The holding jig 80 is also made of material having excellent heat resistance, such as composite ceramic material or carbon. As illustrated in FIGS. 12 and 14, the holding jig 80 includes a frame portion 81 and pressing blocks 84 to 87 provided for the frame portion 81. The frame portion 81 has guide holes 82 in the four corners thereof and has a pressing area 83 in the middle thereof as an opening.

The pressing blocks 84 to 87 have flat pressing surfaces 84a to 87a, respectively, which are planarly engaged with each other to form the flat pressing area 83. When the holding jig 80 is set on the part positioning jig 70, the pressing surfaces 84a to 87a of the pressing blocks 84 to 87 serve as the rear surface of the holding jig 80 and face the part positioning jig 70. The opposite side of the rear surface of the holding jig 80 is the front surface of the holding jig 80. When the holding jig 80 is set on the part positioning jig 70, the pressing blocks 84 to 87 are engaged with each other with a gap T in the pressing area 83 of the holding jig 80. The pressing blocks 84 to 87 are formed in such a manner that the boundary lines thereof do not correspond to the cross line indicated by a dashed line in FIG. 12, which goes through the midpoint of the pressing area 83, but deviate from the cross line going through the midpoint of the pressing area 83 (the boundary lines are shifted from the midpoint in predetermined directions). In addition, for example, the pressing surfaces 86a and 87a of the pressing blocks 86 and 87 among the pressing blocks 84 to are engaged with each other to form a key shape in a planar view (a region R in FIG. 12).

Around peripheral portions of the front surfaces of the pressing blocks 84 to 87, supporting portions 84b to 87b are formed in parallel with a lateral direction of the holding jig 80. The widths of the supporting portions 84b to 87b (in a direction perpendicular to the lateral direction) are set to be larger than the gap T. In addition, around peripheral portions of the front surfaces of the pressing blocks 84 to 87, supporting portions 84c to 87c are formed in parallel with a longitudinal direction of the holding jig 80. The widths of the supporting portions 84c to 87c (in a direction perpendicular to the longitudinal direction) are set to be larger than the gap T. The locations, the number, and the shapes of the supporting portions 84b to 87b and 84c to 87c formed on the pressing surfaces 84a to 87a of the pressing blocks 84 to 87 are not limited to those illustrated in FIG. 12. The supporting portions 84b to 87b and 84c to 87c may suitably be designed depending on the sizes of the pressing blocks 84 to 87, for example. In addition, as illustrated in FIGS. 12 and 15, the pressing blocks 84 and 85 have a convex portion 84b1 and a concave portion 85b1, respectively, on their surfaces facing each other. Thus, the convex portion 84b1 and the concave portion 85b1 of the pressing blocks 84 and 85 adjacent to each other are fitted with each other. Of all the pressing blocks 84 to 87, the pressing block 85 has the largest pressing surface. Thus, while described in details, when the holding jig 80 is set on the part positioning jig 70, the pressing block 85 is easily detached from the pressing area 83 in the direction of the part positioning jig 70. However, use of the convex portion 84b1 and the concave portion 85b1 makes it hard for the pressing block 84 to be detached. Thus, the pressing blocks 84 to 87 are supported by the frame portion 81 with a gap from the part positioning jig 70.

In addition, the pressing surfaces 84a to 87a of the pressing blocks 84 to 87 have pressing portions 84d to 87d (in FIG. 12, the locations of the pressing portions 84d to 87d are indicated by dashed lines). When the holding jig 80 is set on the part positioning jig 70, the pressing portions 84d to 87d are placed on the respective contact parts 30 on the ceramic circuit board 10. For example, when the holding jig 80 is set on the part positioning jig 70, the pressing portions 85d and 84d of the pressing blocks 85 and 84 come into contact with the respective contact parts 30a to 30j, as illustrated in FIG. 13.

[Step S16] After the holding jig 80 is set in step S15, the ceramic circuit board 10 is brought into a reflow oven and is heated at a reflow processing temperature under reduced pressure in the oven (reflow soldering step). For example, the reflow processing temperature is 250° C. or more and 300° C. or less.

Under this temperature, the ceramic circuit board 10 is warped in a downward convex shape (in the direction of the gravitational force) due to the difference among the thermal expansion rates of the insulating layer 11, the circuit pattern layers 12, and the metal layer 13. If the ceramic circuit board 10 is warped, the pressing blocks 84 to 87 of the holding jig 80 that are supported by the contact parts 30 from the rear surface drop in the direction of the part positioning jig 70. The peripheral portions, namely, the supporting portions 84b to 87b and 84c to 87c, of the pressing blocks 84 to 87 are supported by the frame portion 81. In particular, the widths of the supporting portions 84b to 87b and 84c to 87c are set to be larger than the gap T at the individual boundary line. In addition, the boundary lines of the pressing blocks 84 to 87 do not correspond to the cross line in FIG. 12, which goes through the midpoint of the pressing area 83, but deviate from the cross line going through the midpoint of the pressing area 83. Thus, for example, as illustrated in FIG. 16, the pressing blocks 84 to are designed to drop easily from the boundary lines thereof in the direction of the part positioning jig 70 while the supporting portions 84b to 87b and 84c to 87c function as the supporting points.

In contrast, the pressing surfaces 86a and 87a of the pressing blocks 86 and 87 are engaged with each other to form a key shape. Thus, while the pressing blocks 86 and 87 are designed to drop easily from the boundary line thereof in the direction of the part positioning jig 70, the pressing blocks 86 and 87 are not easily detached from each other. In this way, for example, when the holding jig 80 is removed, the holding jig 80 is easily handled.

As described above, the pressing area 83 of the holding jig 80 is inclined with the warp of the ceramic circuit board 10. In this way, even when the contact parts arranged on the warped ceramic circuit board 10 are shifted, since the pressing area 83 moves with the warp of the ceramic circuit board 10, the holding jig 80 appropriately presses the contact parts 30 against the ceramic circuit board 10.

Consequently, when the solder 31 is melted, the circuit pattern layers 12, the semiconductor elements 20, and the contact parts 30 are electrically connected to each other.

Next, when the melted solder 31 is solidified, the semiconductor elements 20 and the contact parts 30 are bonded to the circuit pattern layers 12.

[Step S17] The board positioning jig 60, the part positioning jig 70, and the holding jig 80 are removed from the ceramic circuit board 10 having the circuit pattern layers 12 to which the semiconductor elements 20 and the contact parts 30 have been bonded. Next, the semiconductor elements 20 are electrically connected to predetermined areas of the circuit pattern layers 12 of the ceramic circuit board 10 by bonding wires by using a ultrasonic bonding tool (not illustrated). After connecting the bonding wires 35, external connection terminals (not illustrated) are pressed into the contact parts 30.

[Step S18] The semiconductor elements 20, the contact parts 30, and the bonding wires 35, etc. on the ceramic circuit board 10 are sealed by the sealing material 45.

As described above, the board positioning jig 60, the part positioning jig 70, and the holding jig 80 are used in steps S11, S13, and S15, respectively. The semiconductor device 50 illustrated in FIGS. 2 and 3 is manufactured by using the board positioning jig 60, the part positioning jig 70, and the holding jig 80.

As described above, in the manufacturing method of the above semiconductor device 50, first, the ceramic circuit board 10 and the plurality of contact parts 30 are prepared, the ceramic circuit board 10 including the insulating layer 11, the circuit pattern layers 12 that are formed on the front surface of the insulating layer 11, and the metal layer 13 that is formed on the rear surface of the insulating layer and that has a larger area than those of the circuit pattern layers 12. Next, the contact parts 30 are arranged on the circuit pattern layers 12 of the ceramic circuit board 10 via the solder 31. Next, the pressing blocks 84 to 87 constituting the pressing area 83 of the plate-shaped holding jig 80 are arranged on the contact parts 30. The contact parts 30 are pressed against the ceramic circuit board 10 while heat being applied and the pressing blocks 84 to 87 constituting the pressing area 83 of the holding jig 80 are being inclined with a warp of the ceramic circuit board 10. In this way, when pressing is performed for bonding of the contact parts 30, even if the ceramic circuit board 10 is warped by heating and the contact parts 30 are consequently shifted, the contact parts 30 are pressed against the ceramic circuit board 10 without fail.

According to the embodiments, there is provided a semiconductor device manufacturing method that enables bonding of contact parts without fail even when a multilayer board is warped by heating at the time of the bonding and that prevents reduction of the quality of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device manufacturing method; comprising:

preparing a multilayer board and a plurality of contact parts, the multilayer board including an insulating layer; a circuit pattern layer formed on a front surface of the insulating layer, and a metal layer formed on a rear surface of the insulating layer and having an area larger than an area of the circuit pattern layer in a plan view of the multilayer board;

arranging each of the plurality of contact parts on the circuit pattern layer of the multilayer board via a bonding material;

arranging a pressing area of a main surface of a plate-shaped holding jig on the plurality of contact parts; and while heating the multilayer board, pressing the plurality of contact parts against the multilayer board by inclining the pressing area of the holding jig to conform to a warp of the multilayer board.

2. The semiconductor device manufacturing method according to claim 1, wherein the holding jig includes a plurality of pressing blocks, each of which includes a pressing surface; and the pressing surfaces are planarly engaged with one another to form the pressing area.

3. The semiconductor device manufacturing method according to claim 2,
wherein the arranging of the pressing area includes supporting each of the plurality of contact parts by a corresponding one of the plurality of pressing surfaces of the holding jig, and
wherein the pressing of the plurality of contact parts includes pressing the plurality of contact parts against the multilayer board by moving the plurality of pressing surfaces with movements of the plurality of contact parts due to the warp of the multilayer board.

4. The semiconductor device manufacturing method according to claim 2, wherein a boundary line between any adjacent two of the plurality of pressing surfaces of the holding jig is shifted from a midpoint of the pressing area in a predetermined direction.

5. The semiconductor device manufacturing method according to claim 2, wherein the pressing area has a rectangular shape having side faces facing in a first direction and side faces facing in a second direction orthogonal to the first direction,
a boundary between any adjacent two of the plurality of pressing blocks of the holding jig is located apart from one of first and second center lines, and is parallel to the one of the first and second center lines, the first center line being a line passing through a center of the pressing area in a direction parallel to the first direction, the second center line being a line passing through the center of the pressing area in a direction parallel to the second direction.

6. The semiconductor device manufacturing method according to claim 2, wherein the holding jig includes the plurality of pressing blocks and a frame portion provided with the plurality of pressing blocks.

7. The semiconductor device manufacturing method according to claim 6, wherein supporting portions supported by the frame portion are formed on peripheral portions of surfaces respectively opposite to the pressing surfaces of the pressing blocks.

8. The semiconductor device manufacturing method according to claim wherein each supporting portion has a width larger than a gap between any adjacent two of the plurality of pressing blocks.

9. The semiconductor device manufacturing method according to claim 8, wherein a largest pressing block among the plurality of pressing blocks having a largest pressing surface among the plurality of pressing surfaces area has a first surface, and an adjacent pressing block that is adjacent to the largest pressing block has a second surface facing the first surface, one of the first and second surfaces including a concave portion, the other one of the first and second surfaces including a convex portion that is fitted with the concave portion.

10. The semiconductor device manufacturing method according to claim 1, further comprising, after bonding the plurality of contact parts to the circuit pattern layer by the bonding material, removing the holding jig from the multilayer board.

* * * * *